(12) United States Patent
Weinfurtner et al.

(10) Patent No.: US 6,278,651 B1
(45) Date of Patent: Aug. 21, 2001

(54) HIGH VOLTAGE PUMP SYSTEM FOR PROGRAMMING FUSES

(75) Inventors: Oliver Weinfurtner, Wappingers Falls, NY (US); Gerhard Mueller, Meitingen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/603,051

(22) Filed: Jun. 26, 2000

(51) Int. Cl.$^7$ ........................................ G11C 8/00
(52) U.S. Cl. .................................. 365/230.06; 365/225.7
(58) Field of Search ............................ 365/222, 230.06, 365/225.7

(56) References Cited

U.S. PATENT DOCUMENTS

| | | | |
|---|---|---|---|
| 5,293,386 | 3/1994 | Muhmenthaler et al. | 371/21.1 |
| 5,410,510 | * 4/1995 | Smith et al. | 365/201 |
| 5,933,374 | 8/1999 | Weinfurtner | 365/189.09 |

* cited by examiner

*Primary Examiner*—Trong Phan
*Assistant Examiner*—M. Tran
(74) *Attorney, Agent, or Firm*—Stanton C. Braden

(57) ABSTRACT

A voltage pump system for programming fuses on a semiconductor chip, in accordance with the present invention, includes a first pump system employing a supply voltage of the semiconductor chip as an input. The first pump system supplies an output voltage higher than the supply voltage on a first output line without raising the supply voltage of the semiconductor chip. A second pump system includes an input connected to the first output. The second pump system supplies an output voltage sufficient for programming electrical fuses on the semiconductor chip.

15 Claims, 4 Drawing Sheets

HIGH VOLTAGE PUMP SYSTEM FOR PROGRAMMING FUSES

BACKGROUND

1. Technical Field

This disclosure relates to semiconductor devices and more particularly, to a semiconductor device employing wordline boost voltages (VPP) for programming electrical fuses.

2. Description of the Related Art

For redundancy activation and trimming purposes, semiconductor memory devices include a plurality of fuses. Typically, these fuses are programmed by a laser beam at the wafer-level; however, new types of fuses are electrically programmable and permit programming in a packaged chip.

The level of the programming voltage for the fuses is typically far above the external supply voltage or any internally generated voltage (e.g., 9.0V–12.0V).

The maximum voltage level that can be achieved by a high voltage pump circuit depends on the pump circuit type and the available supply voltage from which the programming voltage is generated by the pump. A formula for a typical pump circuit is:

$$V_{FUSE} = 3 \times V_{SUP} - 3.0V.$$

This means that the maximum achievable fuse programming voltage is three times the supply voltage from which it is generated minus a constant voltage drop of 3.0V, due to internal losses in the pump circuit.

Usually the voltage pump is supplied by the external chip supply voltage, $V_{DD}$. For current semiconductor technologies $V_{DD}$ is about 2.5V. During the burn-in phase of the chip, this voltage is raised by a certain factor (e.g., 1.5). This leads to a 150% increase of all internal voltages on the chip for increased stress of all circuits in order to accelerate early defects.

According to the above formula this permits a fuse programming voltage of:

$$V_{FUSE} = 3 \times (1.5 \times 2.5V) - 3.0V \times 8.25V.$$

This voltage level is not high enough for programming the fuses. Raising $V_{DD}$ to a higher level would permit the pump circuit to reach a higher output level, but would also expose all other circuits on the chip to a voltage stress that is above their reliability.

Therefore, a need exists to achieve a voltage level for programming electrical fuses in a memory device with an on-chip pump circuit without raising the external supply voltage (e.g., $V_{DD}$) above a level which would affect the reliability of circuits which employ the external supply voltage.

SUMMARY OF THE INVENTION

A voltage pump system for programming fuses on a semiconductor chip, in accordance with the present invention, includes a first pump system employing a supply voltage of the semiconductor chip as an input. The first pump system supplies an output voltage higher than the supply voltage on a first output line without raising the supply voltage of the semiconductor chip. A second pump system includes an input connected to the first output. The second pump system supplies an output voltage sufficient for programming electrical fuses on the semiconductor chip.

In alternate embodiments, the first pump system may include a wordline boost voltage pump and the first output includes a wordline boost voltage ($V_{PP}$). $V_{PP}$ may be about 3.1 volts. The output voltage for fuse programming may be between about 9 and about 12 volts. The semiconductor chip may include a dynamic random access memory. The voltage pump may include other circuits to which the supply voltage provides power, and the supply voltage may include a threshold value above which reliability problems are experienced in the other circuits. The threshold value may be about 2.5 volts.

Another voltage pump system for programming fuses on a semiconductor chip, in accordance with the present invention, includes a wordline boost pump system employing a supply voltage of the semiconductor chip as an input. The wordline boost pump system supplies a wordline boost voltage, which is higher than the supply voltage on a first output line without raising the supply voltage of the semiconductor chip. A fuse voltage pump system includes an input connected to the first output. The fuse voltage pump system supplies an output voltage sufficient for programming electrical fuses on the semiconductor chip. A plurality of electrical fuses are disposed on the semiconductor chip and programmed on-chip by the output voltage of the fuse voltage pump system in accordance with addressing information.

In alternate embodiments, the wordline boost voltage is about 3.1 volts. The output voltage for fuse programming may be between about 9 and about 12 volts. The semiconductor chip preferably includes a dynamic random access memory. The voltage pump system may include other circuits to which the supply voltage provides power, and the supply voltage may include a threshold value above which reliability problems are experienced in the other circuits. The threshold value may be about 2.5 volts. The addressing information may include redundancy calculation results. The voltage pump system may include a fuse line coupled to the output line of the fuse programming pump for providing the output voltage sufficient for programming electrical fuses to program the fuses in accordance with the addressing information.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides a higher voltage for programming electrical fuses by employing another pump system, which is available in semiconductor memory devices. In a particularly useful embodiment, a wordline boost voltage $V_{PP}$ is employed to provide a fuse programming voltage for on-chip electrical fuse programming in accordance with the invention. Advantageously, on a dynamic random access memory (DRAM) that provides the wordline boost voltage $V_{PP}$, the $V_{PP}$ level is above the external supply voltage $V_{DD}$, for example, $V_{PP}$=3.1V for $V_{DD}$=2.5V.

The present invention employs this $V_{PP}$ voltage as a supply voltage for a fuse high voltage pump. In this example, according to the formula set forth above, a fuse voltage may be defined as:

$$V_{FUSE}=BV_{Burn-in}-L,$$

where:

B includes a multiplier representing a maximum achievable fuse programming voltage based on a burn-in voltage, $V_{Burn-in}$, $V_{Burn-in}$ includes a fuse voltage higher than supply voltage $V_{DD}$, in a preferred embodiment $V_{Burn-in}$ includes $FV_{PP}$ modified by a factor, F, e.g., 150%; and L is a constant voltage drop due to internal losses in a pump circuit, e.g., 3V. These parameters may be different based on the voltage pump(s) employed.

Illustratively, for a DRAM chip:

$$V_{FUSE}=3\times(1.5\times3.1V)-3.0V=10.95V,$$

where B=3, F=1.5, $V_{PP}$=3.1V and L=3. This voltage level is sufficient for fuse programming, which needs a fuse programming voltage of, for example, between about 9.0V to about 12.0V.

Figure 1:
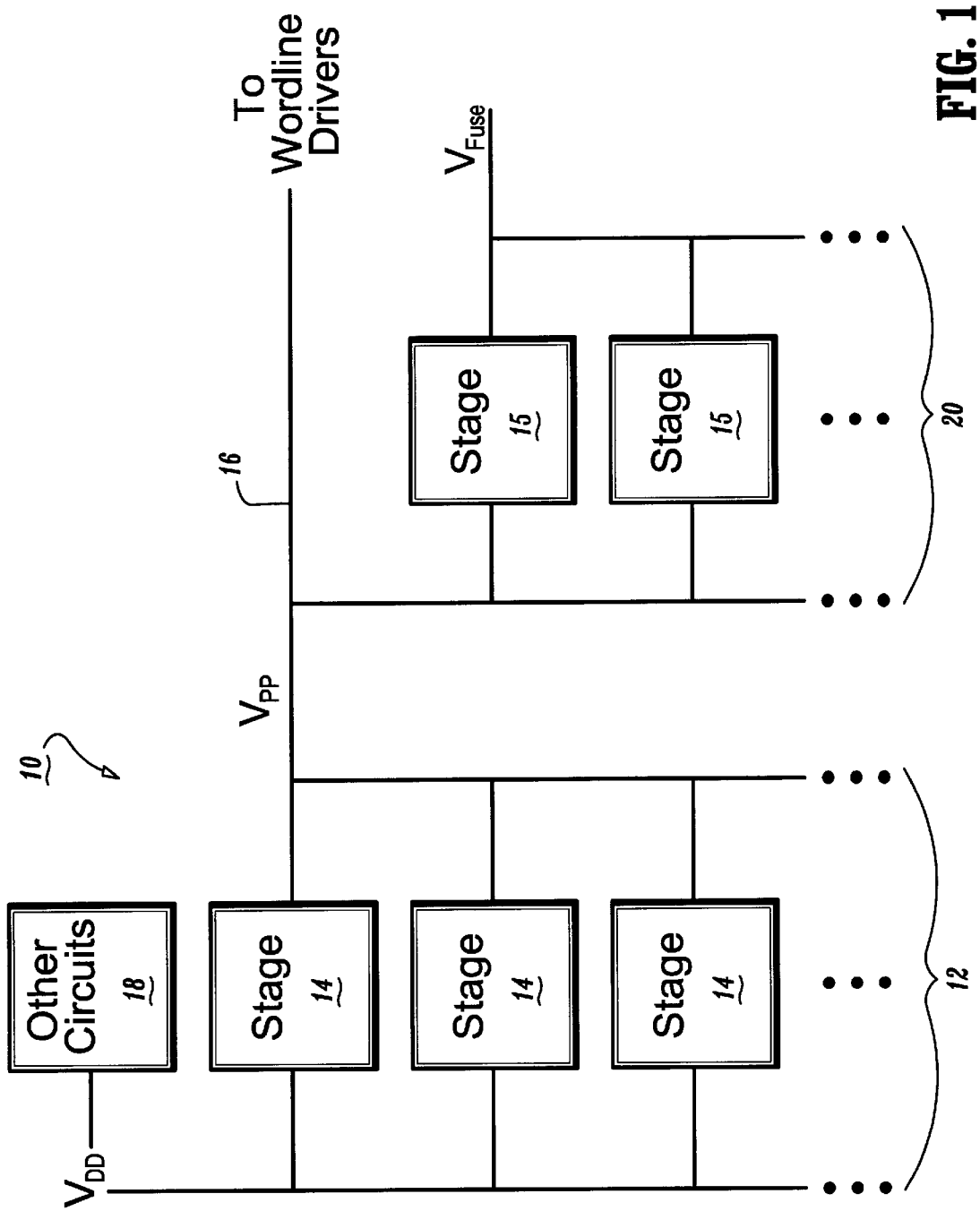
FIG. 1 is a schematic diagram showing a cascaded pump system for supplying an on-chip fuse programming voltage in accordance with the present invention.

Referring now in specific detail to the drawings in which like reference numerals identify similar or identical elements throughout the several views, and initially to FIG. 1, a schematic diagram of a voltage pump system 10 of the present invention is illustratively shown. FIG. 1 shows a new cascaded supply of a fuse high voltage pump system 20 by the $V_{PP}$ pump system 12. Voltage pump system 10 is included on a semiconductor device, for example a DRAM, embedded DRAM, or customized memory device. A first pump system 12 includes a plurality of stages 14. Each stage 14 includes a pump circuit for increasing an output voltage. Pump system 12 provides a wordline boost voltage $V_{PP}$ as an output.

In the illustrative embodiment, stages 14 amplify a supply voltage $V_{DD}$ to a wordline boost voltage $V_{PP}$. In one embodiment, $V_{DD}$ is about 2.5 volts and $V_{PP}$ is about 3.1 volts. $V_{PP}$ is output to line 16 to provide wordline drivers (not shown) with a higher gate voltage to improve access time when attempting to retrieve stored data from memory cells or write data to memory cells.

Advantageously, a separate fuse pump system 20 is provided in accordance with the present invention. Pump system 20 employs $V_{PP}$ as an input voltage. Stages 15 are provided to amplify $V_{PP}$ to achieve $V_{Fuse}$ as an output. Prior art systems relied on $V_{DD}$ directly for deriving $V_{Fuse}$. Raising $V_{DD}$ to a level capable of fuse programming, subjects all circuits connected to $V_{DD}$ to have an increased voltage applied to the circuit. This created the potential for reliability problems. Now, in accordance with the present invention, $V_{DD}$ can remain constant and below a threshold level, above which can cause reliability problems for the on-chip circuits, which rely on $V_{DD}$. It is therefore no longer necessary to raise the external supply voltage to a level above the reliability limit and thus to stress other parts of the chip more than desired. $V_{DD}$ is advantageously kept at or below the threshold (for example, about 2.5 volts) above which damage may be imparted to other circuit 18.

The embodiment shown in FIG. 1 also provides a more robust pump system. For example, the drive capability of the $V_{PP}$ pump system 12 may be in the range of about 12 mA–30 mA. The needed current of the fuse pump system 20, in accordance with the present invention, lies in the range of about 400 $\mu$A to about 1 mA. Even with a current efficiency as low as 10% of the fuse pump system 20, the $V_{PP}$ system is capable of fully supplying the fuse pump system 20 to permit the programming of fuses. Advantageously, the present invention achieves the required programming voltage level for electrical fuses with an on-chip pump circuit without the need to expose other circuits to voltage stress above their reliability level.

Figure 2:
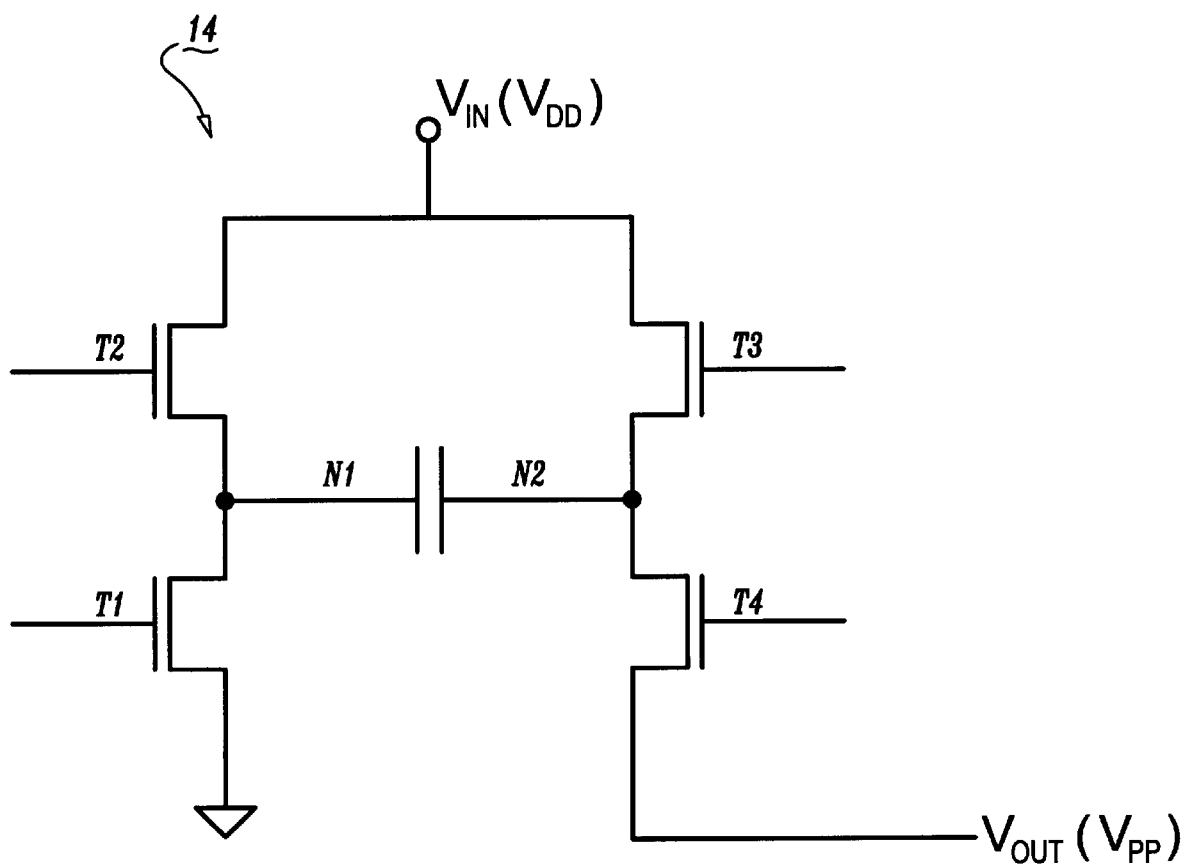
FIG. 2 is a schematic diagram showing an illustrative pump system for generating a wordline boost voltage.

Referring to FIG. 2, stages 14, which may be employed with the pump system FIG. 1 are illustratively shown. Stage 14 may be operated in two sequences. In a first sequence, transistors T1 and T3 are on, and transistors T2 and T4 are off. Node N1 is discharged to ground, and node N2 is charged to VIN (which is $V_{DD}$ in this example). Then, in the second sequence, transistors T1 and T3 are off, and transistors T2 and T4 are on. Node N1 is charged to VIN level ($V_{DD}$). This boosts node N2 to two times VIN (two times $V_{DD}$). This boosted voltage ($V_{PP}$) is released to VOUT through transistor T4. Other pump circuits may be employed for the present invention.

Figure 3:
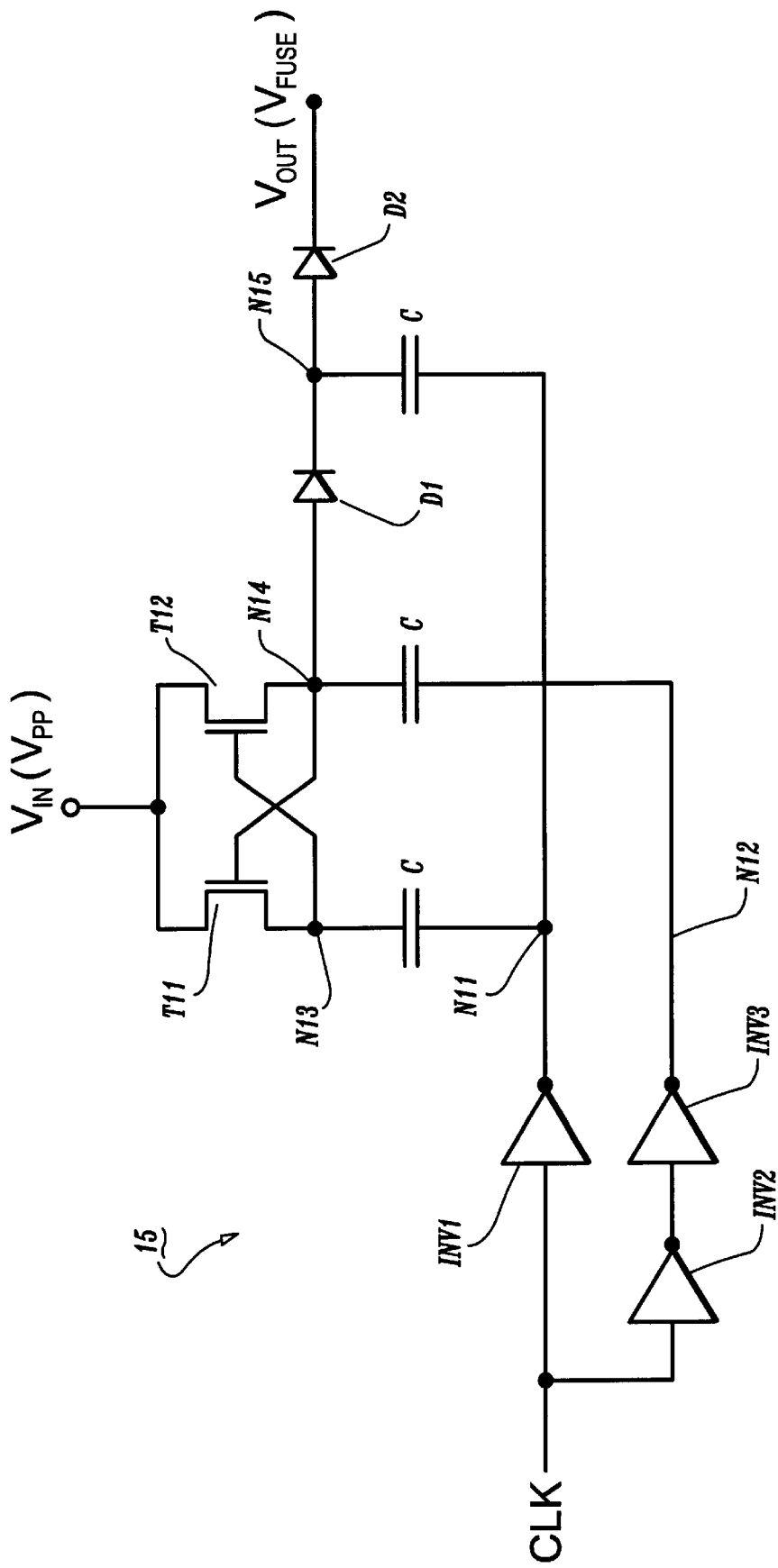
FIG. 3 is a schematic diagram showing an illustrative pump system for a generating a fuse voltage in accordance with the present invention.

Referring to FIG. 3, stage 15 of the $V_{Fuse}$ pump system of FIG. 1 is illustratively shown. When node N11 is low, node N12 is high (VIN or $V_{PP}$ in this example) as provided by inverters Inv1, Inv2 and Inv3. When a clock signal CLK changes, N11 goes high and N12 goes low. The rising N11 level boosts N13 to two times VIN ($V_{PP}$) level, which turns transistor T12 on and permits node N14 to reach VIN level. With a next clock (CLK) phase, node N13 goes low again, which turns transistor T12 off. At the same time N12 goes high again, node N14 is boosted to two times VIN. This turns transistor T11 on and permits N13 to reach VIN level. At the same time, the charge flows from N14 through diode D1 into node N15. The voltage on node N15 is boosted a second time by the rise of N11 and flows through diode D2 out of stage 15 (VOUT or $V_{Fuse}$). The boosting is provided by employing capacitors C. Other pump circuits may be employed for the present invention.

Figure 4:
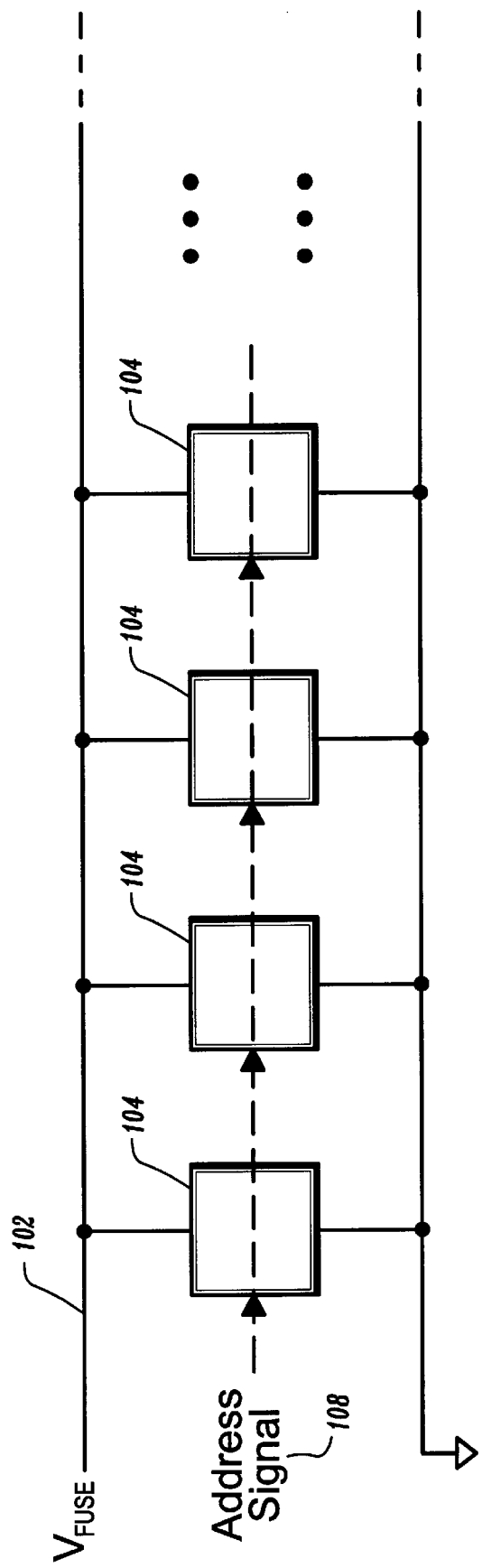
FIG. 4 is a schematic diagram showing an illustrative fuse addressing scheme for fuse programming on a semiconductor device in accordance with the present invention.

Referring to FIG. 4, an illustrative fuse programming circuit 100 is shown. $V_{Fuse}$ is generated by pump 20 of FIG. 1. $V_{Fuse}$ is then input to a fuse line 102, which provides $V_{Fuse}$ to each fuse 104 that needs to be programmed. Line 102 provides $V_{Fuse}$ to the appropriate fuses 104 in accordance with addressing information 108. Addressing information 108 may be based on the results of a redundancy calculation, for example. Fuses 104 include electrically programmable fuses, which are programmed on-chip by employing the pump system of the present invention.

Having described preferred embodiments for high voltage pump system for programming fuses (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims:

What is claimed is:

1. A voltage pump system for programming fuses on a semiconductor chip, comprising:

a first pump system employing a supply voltage of the semiconductor chip as an input, the first pump system supplying an output voltage higher than the supply voltage on a first output line without raising the supply voltage of the semiconductor chip; and a second pump system including an input connected to the first output line, the second pump system supplying an output voltage sufficient for programming electrical fuses on the semiconductor chip.

2. The voltage pump system as recited in claim 1, wherein the first pump system includes a wordline boost voltage pump and the first output includes a wordline boost voltage ($V_{PP}$).

3. The voltage pump system as recited in claim 2, wherein $V_{PP}$ is about 3.1 volts.

4. The voltage pump system as recited in claim 1, wherein the output voltage for fuse programming is between about 9 and about 12 volts.

5. The voltage pump system as recited in claim 1, wherein the semiconductor chip includes a dynamic random access memory.

6. The voltage pump system as recited in claim 1, further comprising other circuits to which the supply voltage provides power, and the supply voltage includes a threshold value above which reliability problems are experienced in the other circuits.

7. The voltage pump system as recited in claim 6, wherein the threshold value is about 2.5 volts.

8. A voltage pump system for programming fuses on a semiconductor chip, comprising:

a wordline boost pump system employing a supply voltage of the semiconductor chip as an input, the wordline boost pump system supplying a wordline boost voltage which is higher than the supply voltage on a first output line without raising the supply voltage of the semiconductor chip;

a fuse voltage pump system including an input connected to the first output, the fuse voltage pump system supplying an output voltage sufficient for programming electrical fuses on the semiconductor chip; and a plurality of electrical fuses disposed on the semiconductor chip and programmed on-chip by the output voltage of the fuse voltage pump system in accordance with addressing information.

9. The voltage pump system as recited in claim 8, wherein the wordline boost voltage is about 3.1 volts.

10. The voltage pump system as recited in claim 8, wherein the output voltage for fuse programming is between about 9 and about 12 volts.

11. The voltage pump system as recited in claim 8, wherein the semiconductor chip includes a dynamic random access memory.

12. The voltage pump system as recited in claim 8, further comprising other circuits to which the supply voltage provides power, and the supply voltage includes a threshold value above which reliability problems are experienced in the other circuits.

13. The voltage pump system as recited in claim 12, wherein the threshold value is about 2.5 volts.

14. The voltage pump system as recited in claim 8, wherein the addressing information includes redundancy calculation results.

15. The voltage pump system as recited in claim 8, further comprising a fuse line coupled to the output line of the fuse programming pump for providing the output voltage sufficient for programming electrical fuses to program the fuses in accordance with the addressing information.

* * * * *